United States Patent
Irslinger

(10) Patent No.: US 8,740,043 B2
(45) Date of Patent: Jun. 3, 2014

(54) SELECTIVE SOLDER STOP

(75) Inventor: Hans-Martin Irslinger, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 750 days.

(21) Appl. No.: 12/573,181

(22) Filed: Oct. 5, 2009

(65) Prior Publication Data

US 2010/0089979 A1    Apr. 15, 2010

(30) Foreign Application Priority Data

Oct. 13, 2008  (DE) .......................... 10 2008 042 777

(51) Int. Cl.
   *B23K 1/20* (2006.01)
   *B23K 20/18* (2006.01)

(52) U.S. Cl.
   USPC ......................................... 228/118; 228/203

(58) Field of Classification Search
   USPC ........... 228/118, 178, 179.1, 180.1, 245, 249, 228/4.1, 6.1, 6.2
   See application file for complete search history.

(56) References Cited

U.S. PATENT DOCUMENTS 4,904,498 A * 2/1990 Wu .............................. 427/556
6,372,623 B1 * 4/2002 Hoffman et al. .............. 438/613

FOREIGN PATENT DOCUMENTS

JP  2008-085272  * 4/2008

OTHER PUBLICATIONS

Machine Translation of JP 2008-085272 (Apr. 10, 2008) from JPO website.*

* cited by examiner

*Primary Examiner* — Aaron Austin
*Assistant Examiner* — Megha Mehta
(74) *Attorney, Agent, or Firm* — Kenyon & Kenyon LLP

(57) ABSTRACT

A method for producing a surface on a component, which has regions having different wettabilities with respect to a solder. The method includes forming a first metallic layer on the component and forming a second metallic layer on the first metallic layer, the second metallic layer preventing oxidation of the first metallic layer. The method furthermore includes removing the second metallic layer with the aid of a laser in a predefined surface region for exposing the first metallic layer, and oxidizing the exposed first metallic layer on the surface, which results in a wettability with respect to a solder in the predefined surface region that is less than in a surface region adjacent to the predefined surface region.

9 Claims, 5 Drawing Sheets

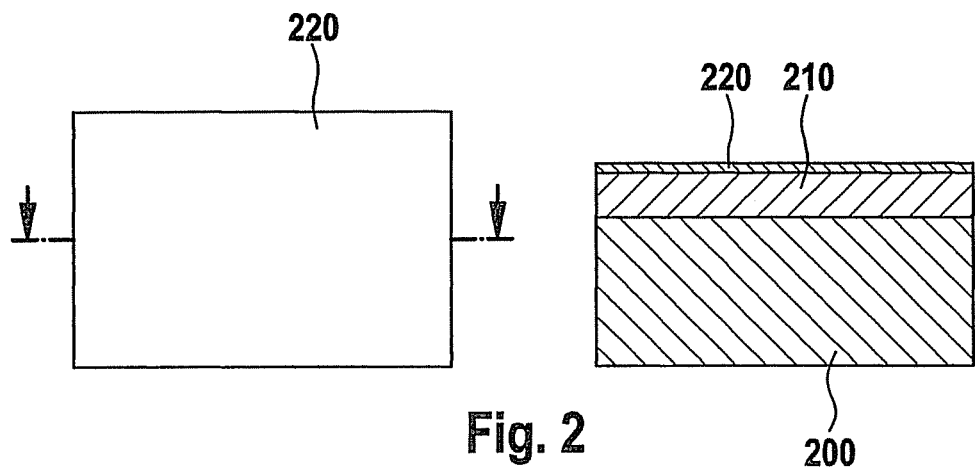
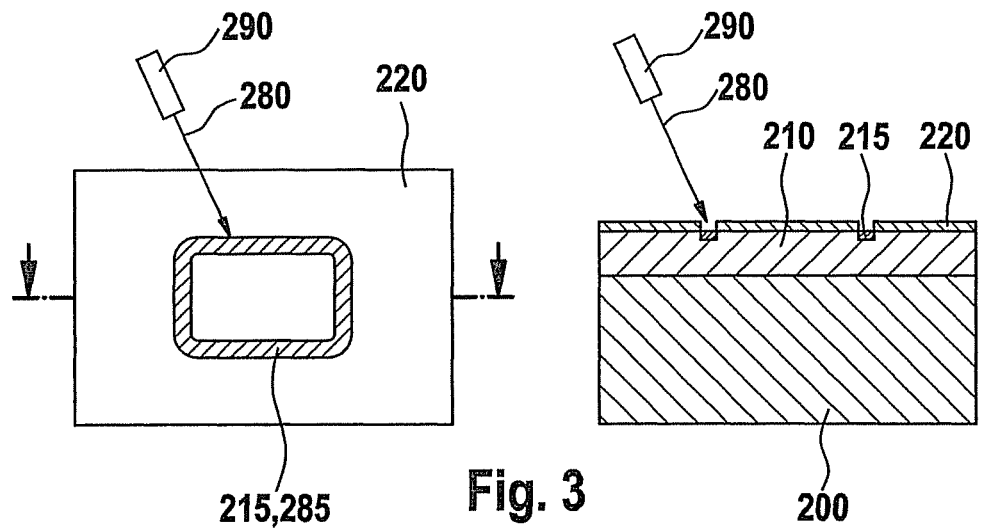

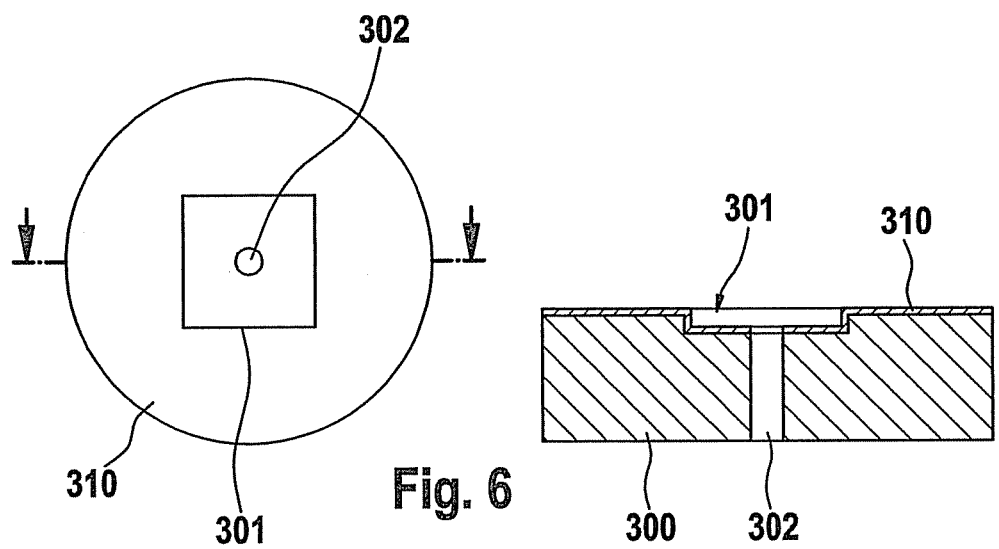
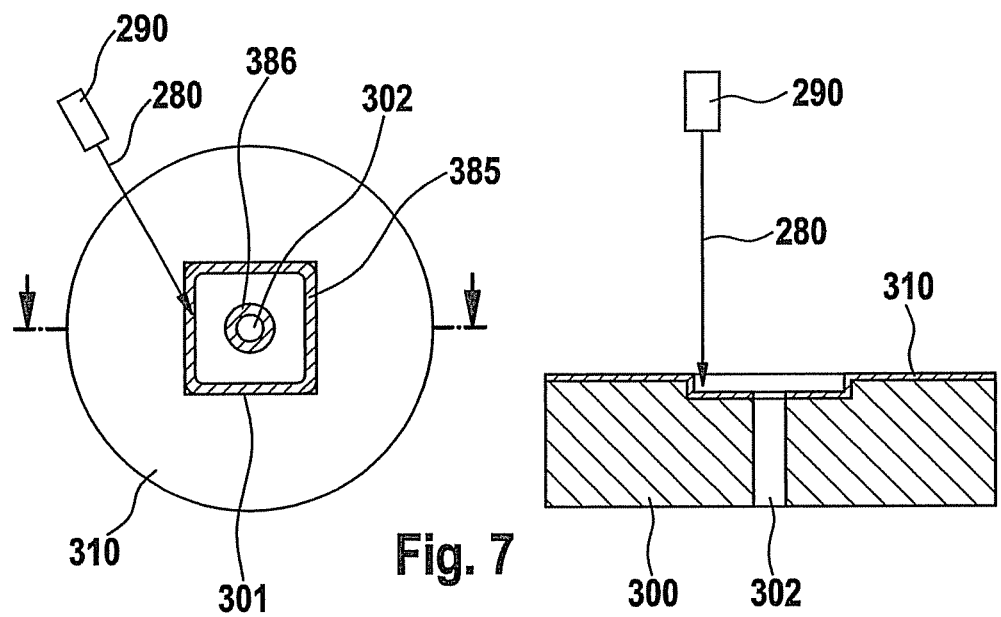

SELECTIVE SOLDER STOP

CROSS-REFERENCE

The present application claims the benefit under 35 U.S.C. §119 of German Patent Application No. 102008042777.2 filed on Oct. 13, 2008, the entirety of which is expressly incorporated herein by reference.

FIELD OF THE INVENTION

The present invention relates to a method for producing a surface on a component, which has regions having different wettabilities with respect to a solder. The present invention further relates to a method for bonding a first component to a second component via a solder.

BACKGROUND INFORMATION

Soldering is a common method for integrally bonding (joining) components. In this method, the components are bonded via a molten metal or metal alloy, also known as solder. In order to produce bonds that are as free of degassing and residues as possible, as is required, for example, in the area of micromechanical sensors, flux-free solders are used.

Typically pure nickel layers are formed on the parts to be joined (which often contain steel, nickel alloys, etc.), since such layers make obtaining stable intermetallic compounds possible. The problem, however, is that nickel layers have a strong tendency toward surface oxidation. Surface oxidation may occur even at room temperature and is promoted in particular by increased moisture or increased temperature. The formation of an oxide layer results in reduction of the flow characteristics and wetting characteristics compared to a (flux-free) solder, which interferes with the formation of a soldered bond. In extreme cases no bonding of the solder occurs at all. To prevent undesirable effects of this type, a nickel layer is normally provided with oxidation protection or tarnish protection. A gold layer is then normally formed on the nickel layer, so that a reduction of wettability by a solder is prevented.

The surface region on a component which is to be wetted by a solder is often defined or delimited. Therefore, the component is selectively coated with nickel and gold in order to limit wetting by solder to a defined surface region. For this purpose, a structured masking layer is formed on the component in question prior to forming the nickel layer, which results in the nickel and gold layers being formed only in regions between the masking layer. This procedure is, however, relatively complicated and therefore associated with high manufacturing costs.

SUMMARY

An object of the present invention is to provide an improved method for producing a surface on a component, which has regions having different wettabilities with respect to a solder and a corresponding method for bonding two components.

According to the present invention, an example method is proposed for producing a surface on a component, the surface having regions of different wettabilities with respect to a solder. The example method includes forming a first metallic layer on the component and forming a second metallic layer on the first metallic layer, the second metallic layer preventing oxidation of the first metallic layer. The method furthermore includes removing the second metallic layer with the aid of a laser in a predefined surface region for exposing the first metallic layer, and oxidizing the exposed first metallic layer on the surface, which results in a wettability with respect to a solder in the predefined surface region that is less than in a surface region adjacent to the predefined surface region.

The example method according to the present invention makes it possible to produce, in a simple and cost-effective manner, a surface on a component, which has regions having different wettabilities with respect to a solder. Instead of using a masking layer, a surface region having reduced wettability is produced by selectively removing the second metallic layer and oxidizing the first metallic layer exposed in this region. A common marking laser may be used here.

According to a preferred specific example embodiment, the first metallic layer contains nickel. In this way, the component is suitable for producing a relatively stable soldered bond. It is furthermore advantageous that the second metallic layer contains gold. Thereby, on the one hand, reliable oxidation protection of the nickel thereunder is achieved and, on the other hand, high wettability with respect to a solder is made possible.

According to another preferred specific example embodiment, the predefined surface region in which the second layer is removed has the shape of a line. In this way, a surface region which is to be wetted by a solder may be defined on the surface of the component relatively rapidly, this region being separated from another surface region, on which no wetting is to take place, by the line.

Furthermore, according to the present invention, an example method is proposed for bonding a first component to a second component. In this example method, a surface is produced on the first component by performing the above-described method, the surface having a soldering region to be wetted using solder, this surface being adjacent to a predefined surface region having a lesser wettability. A solder is applied to the soldering region and melted. The first and second components are brought close together in order to bond the first and second components via the solder.

This example method makes is possible to produce a soldered bond between the first and second components in a simple and cost-effective manner. By providing the surface region with a lesser wettability, it becomes possible to limit wetting by the solder to the soldering region.

BRIEF DESCRIPTION OF THE DRAWINGS

The present invention is explained in greater detail below.

FIGS. 2 through 4 show the production of a soldered joint between two components, including the production of a selective solder stop in a top view and in a top and a lateral sectional view.

FIGS. 6 through 8 show the production of a soldered joint between two other components in a top view and in a lateral sectional view.

DETAILED DESCRIPTION OF EXAMPLE EMBODIMENTS

Figure 1:
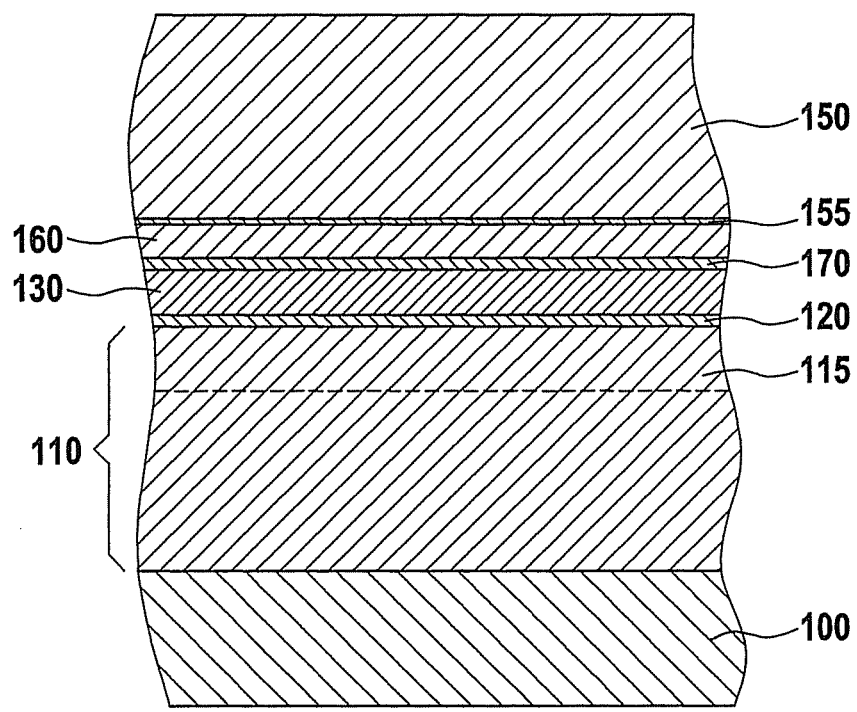
FIG. 1 shows a joint between two components via a solder in an enlarged lateral sectional view.

FIG. 1 shows the structure of a joint between a first component 100 and a second component 150 via a solder 130 in a lateral sectional view (without the depiction of the intermetallic phases). Component 100 may be a metallic component, for example, which contains steel, for example. Component 150 may contain glass, for example.

To bond component 100 to component 150, a layer stack composed of a nickel layer 110 and a gold layer 120 is provided on component 100. Nickel layer 110 makes it possible to produce a relatively stable soldered joint. Gold layer 120 prevents nickel layer 110 from being oxidized, making a strong bond and high wettability with respect to solder 130 possible. In order to coat component 100, electrochemical or chemical (currentless) deposition methods may be used. Alternatively, layers 110, 120 may be produced using a cathode sputtering method. If nickel layer 110 is produced by chemical deposition, nickel layer 110 may contain some phosphorous. It has a higher concentration in particular on a surface of nickel layer 110 than indicated in FIG. 1 by region 115.

A surface coating composed of a nickel layer 160 and a gold layer 170 is provided also on component 150, which makes a stable bond possible and ensures high wettability with regard to solder 130. Layers 160, 170 may also be produced with the aid of an electrochemical or chemical deposition method or with the aid of a sputtering method. To achieve sufficient adhesion of nickel layer 160 to the glass material of component 150, component 150 is furthermore provided with a bonding agent layer 155 prior to forming nickel layer 160. Bonding agent layer 155 may contain chromium, for example.

To produce the joint depicted in FIG. 1, solder 130 may be provided in liquid or molten form on at least one of components 100, 150 or their gold layers 120, 170, and components 100, 150 may be brought close together to cause intermetallic compounds to form between layers 110, 120 of component 100 and layers 160, 170 of component 150 and solder 130. Solder 130 may be a flux-free solder, which makes the joint degassing- and residue-free.

If layers 110, 120 and 155, 160, 170 are applied to a large surface of the two components 100 and 150, respectively, solder 130 may wet a large surface of components 100, 150 or of one of components 100, 150. In general, however, only a locally limited adhesion of solder 130 is strived for. Instead of forming a structured masking layer for this purpose, which is associated with a relatively high degree of complexity, the use of a laser is provided according to the example embodiment of the present invention for selectively producing reduced wettability on a component surface. This procedure is explained below with reference to the figures.

Figure 4:
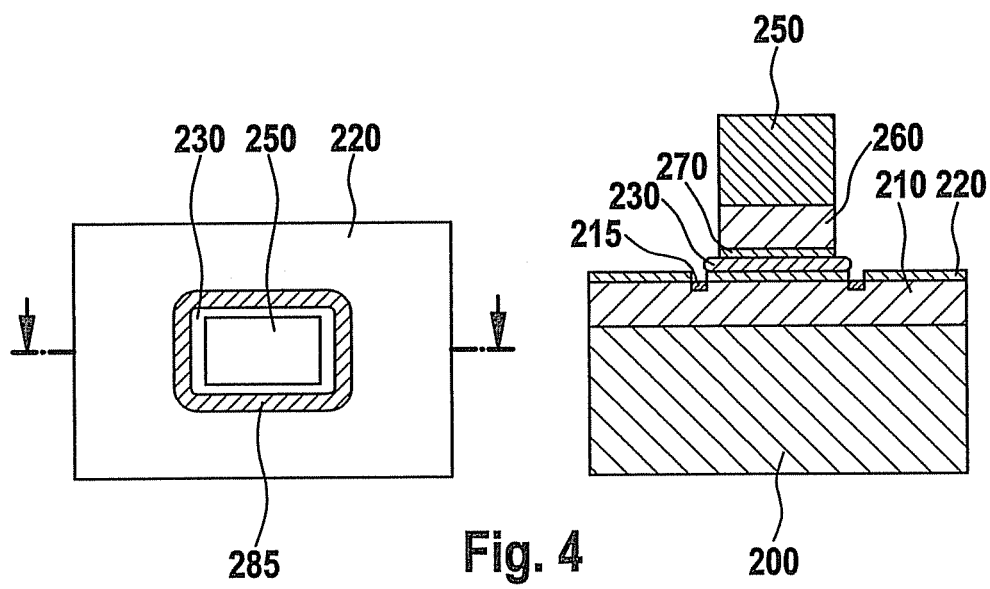

FIGS. 2 through 4 show the production of a joint between two components 200, 250, in a top view (left-hand side) and in a lateral sectional view (right-hand side). Component 200 may be a metallic component, for example, which contains steel or a nickel alloy, for example. Component 250 may also be a metallic component or it may contain glass as an alternative.

As FIG. 2 shows, a surface coating is formed on prepared component 200. For this purpose, a nickel layer 210 is applied on component 200 and a gold layer 220 is applied on nickel layer 210. Layers 210, 220 may be produced with the aid of an electrochemical or chemical deposition method or with the aid of a cathode sputtering method. To form the gold layer in a simple and cost-effective manner, gold layer 220 is preferably produced by chemical deposition on nickel layer 210. For the same purpose, the gold layer is preferably produced to have a relatively small thickness of less than one micrometer. Gold layer 220 reliably protects nickel layer 210 against tarnishing or oxidizing.

As FIG. 3 shows, a laser 290 is used to remove or evaporate gold layer 220 in a predefined surface region 285 and thus to selectively expose nickel layer 210. For this purpose, a laser beam 280 emitted by laser 290 is directed onto the surface coating of component 200 and is guided along thereon. Exposed nickel layer 210 is then oxidized on the surface, so that an oxide layer 215 is formed on surface region 285. Due to oxide layer 215, the fluxing and wetting characteristics with respect to a solder are reduced in region 285 compared to a surface region adjacent to region 285. Predefined region 285 may be designed as a closed line, as FIG. 3 shows, and is therefore referred to hereinafter as solder stop line 285. Solder stop line 285 encloses a soldering region to be wetted by a solder on the surface of component 200, prepared using coatings 210, 220.

The use of laser 290 makes it possible to produce solder stop line 285 accurately and rapidly. Common marking lasers are suitable for this purpose. A high processing rate may be achieved in particular in the case of a small thickness of gold layer 220 of less than one micrometer. Furthermore, for such a thickness, solder stop line 285 may be produced using a relatively low laser power 290. Laser 290 may be operated in such a way that, in addition to the selective removal of gold layer 220, it also causes energy and heat to be input into exposed nickel layer 210. If component 200 is exposed to an oxygen atmosphere when using laser 290, the energy input of laser 290 may cause the formation of oxide layer 215.

Surface oxidation takes place only in the exposed portion of nickel layer 210, whereas the portion of nickel layer 210 covered by gold layer 220 is not accessible to oxidation. The geometric extension of solder stop line 285 is therefore determined exclusively by the removal of gold layer 220. In this way, solder stop line 285 may be produced very accurately and, if necessary, to have a small width.

Instead of causing oxidation due to an energy input by laser 290, the (complete) formation of oxide layer, 215 may also occur following the selective removal of gold layer 220. For this purpose, an additional temperature step may be performed for heating component 200 and/or component 200 may be exposed to an oxygen-containing or oxygen-rich atmosphere.

As FIG. 4 shows, after the formation of solder stop line 285, component 200 is bonded to another component 250 via a solder 230. The lateral extension of component 250 is smaller than the soldered region enclosed by solder stop line 285. A surface coating, including a nickel layer 260 and a gold layer 270, is also formed on the other component 250. If necessary, component 250 may be coated using a bonding agent (for example, made of chromium) prior to the formation of nickel layer 260 in order to make sufficient adhesion of nickel layer 260 possible.

For bonding components 200, 250 by integrally joining, solder 230 may be applied onto gold layer 220 of component 200 in the soldering region enclosed by solder stop line 285 and melted using a temperature step. Subsequently, components 200, 250 are brought close together in order to cause the formation of intermetallic compounds between the surface coatings of components 200, 250 and solder 230. Solder 230 may be a flux-free solder, which makes the joint degassing- and residue-free. Solder 230 may contain metals such as, for example, copper, zinc, silver, indium, lead.

Solder 230 may be applied to the soldering region of component 200 in the form of a solid platelet, for example, and then melted. Alternatively, the use of a solder paste is conceivable, applied by printing, for example, or using a dispensing method. After applying the solder paste, components 200, 250 may be brought close together and then the solder paste may be melted for producing the intermetallic compounds.

The solder paste may also be melted prior to bringing components 200, 250 close together. Solder stop line 285 and oxide layer 215 prevent solder 230 (in the case of an appropriately defined quantity of solder) from wetting gold layer 220 of component 200 in a surface region outside the soldering region enclosed by solder stop line 285.

Figure 5:
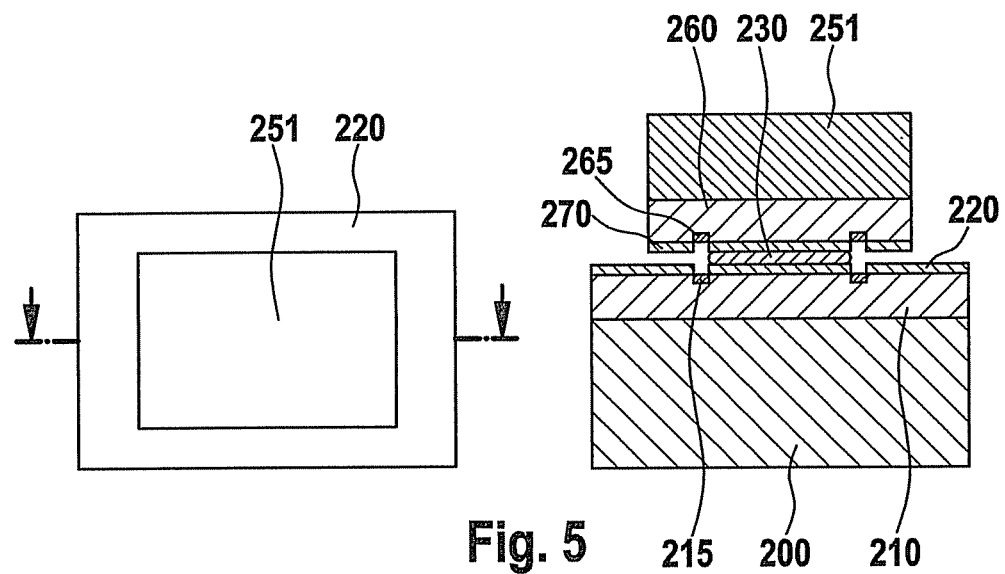
FIG. 5 shows another soldered joint between two components in a top view and in a lateral sectional view.

FIG. 5 shows a soldered joint according to an alternative exemplary embodiment. Component 200 is bonded to a component 251 via solder 230, the lateral extension of component 251, contrary to component 250, being larger than the soldering region enclosed by solder stop line 285. To achieve only a locally defined wetting by solder 230, like component 200, also on the surface, or on surface coating 260, 270 of component 251, component 251 also has a solder stop line formed by a nickel oxide layer 265. Solder stop line 265 may also be produced by selectively removing gold layer 270 with the aid of a laser and oxidizing exposed nickel layer 260. In this way, wetting with solder 230 may be limited to a soldering region on component 251, which is defined, i.e., enclosed, by solder stop line 265. To produce the soldered joint, solder 230 may in turn be applied to the soldering region of component 200, or additionally or exclusively to the soldering region of component 251.

Figure 8:
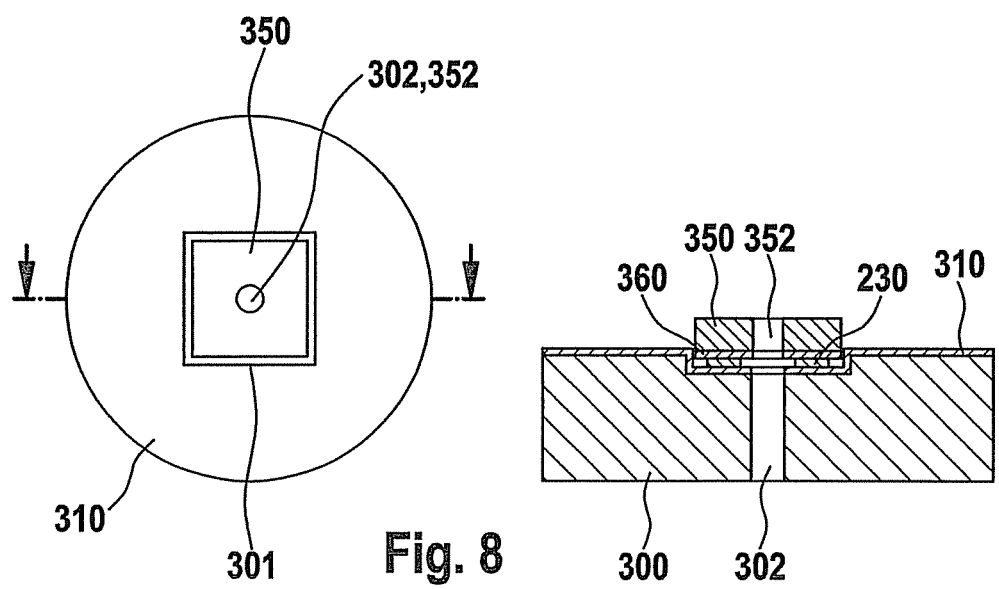

FIGS. 6 through 8 show the production of a soldered joint between two other components 300, 350 in a top view (left-hand side) and in a lateral sectional view (right-hand side). Component 300 is a metallic socket for a TO cell of a micromechanical pressure sensor. Component 350 represents a glass body to which a sensor chip (not depicted) may be attached.

Socket 300 has a generally circular shape in top view, a generally square recess 301 being provided in its center for receiving component 350. Both components 300, 350 have holes 302, 352 passing through components 300, 350. Holes 302, 352 come to lie above each other to apply a defined pressure onto a sensor chip installed on component 350. Socket 300 may also have through contacts for connecting the sensor chip (not depicted).

As FIG. 6 shows, a surface coating 310 is applied on a large surface of prepared socket 300. Coating 310 includes a nickel layer applied to socket 300 and a gold layer applied on the nickel layer. Coating 310 may also cover the lateral walls of hole 302 (not depicted).

In order to achieve wetting of coating 310 by a solder only in the area of recess 301, as FIG. 7 shows, a solder stop line 385 situated on the edge of recess 301 and a solder stop line 386 situated around hole 302 are produced. For this purpose, a laser 290 is used, which emits a laser beam 280 for removing the gold layer and for exposing the nickel layer of coating 310. Due to the energy input of laser 290, the exposed nickel layer on the surface may be oxidized and the wetting characteristics may thus be reduced. Solder stop lines 385, 386 define a soldering region in recess 301.

Subsequently a flux-free solder 230 (for example, in the form of a platelet) is applied to the soldering region in recess 301 and is melted. Furthermore, component 350, which is provided with a surface coating 360 made of a bonding agent layer, a nickel layer, and a gold layer (similarly to component 150 of FIG. 1), is introduced into recess 301, so that the structure depicted in FIG. 8 results. Solder stop lines 385, 386 prevent solder 230 from flowing onto the surface or surface coating 310 of component 300 outside the recess and from wetting the lateral walls of hole 302.

The example methods explained with reference to the figures represent possible specific embodiments of the present invention. Other methods representing variants or combinations of the above-described methods may also be implemented. For example, a plurality of soldering regions, defined by solder stop lines, may be formed on a surface of a component. Furthermore, a solder stop line may have an open, rather than a closed, shape to prevent, as a barrier, a flux from flowing from a predefined soldering region to another surface region. A surface region having a reduced wettability may also be formed with the aid of a laser to have a shape different from that of a line, for example, a (large) surface.

Instead of the specified materials, other materials may be alternatively used. For example, instead of the gold layer, another noble metal layer, for example, a platinum layer, may be used as a tarnishing protection. Also, instead of the nickel layer, another solderable layer, for example, a copper or titanium layer, may be alternatively used. Instead of layers having only one chemical element, layers having a plurality of elements, or also alloys are possible.

What is claimed is:

1. A method for producing a surface on a component, the surface having regions of different wettabilities with respect to a solder, the method comprising:
   forming a first metallic layer on the component;
   forming a second metallic layer on the first metallic layer, the second metallic layer preventing oxidation of the first metallic layer;
   removing the second metallic layer using a laser in a predefined surface region to expose the first metallic layer; and
   oxidizing the exposed first metallic layer on the surface, resulting in a wettability with respect to a solder in the predefined surface region that is less than in a surface region adjacent to the predefined surface region.

2. The method as recited in claim 1, wherein the first metallic layer contains nickel.

3. The method as recited in claim 1, wherein the second metallic layer contains gold.

4. The method as recited in claim 1, wherein the second metallic layer has a thickness of less than one micrometer.

5. The method as recited in claim 1, wherein the predefined surface region in which the second metallic layer is removed has the shape of a line.

6. The method as recited in claim 1, wherein the first metallic layer is formed using one of the following processes:
   electrolytic deposition;
   deposition without external current; and
   cathode sputtering.

7. The method as recited in claim 1, wherein the second metallic layer is formed using one of the following processes:
   electrolytic deposition;
   deposition without external current; and
   cathode sputtering.

8. The method as recited in claim 1, wherein the oxidation of the exposed first metallic layer is caused by an energy input of the laser into the first layer.

9. A method for bonding a first component to a second component, comprising:
   producing a surface on the first component by forming a first metallic layer on the component, forming a second metallic layer on the first metallic layer, the second metallic layer preventing oxidation of the first metallic layer, removing the second metallic layer using a laser in a predefined surface region to expose the first metallic layer, and oxidizing the exposed first metallic layer on the surface, resulting in a wettability with respect to a solder in the predefined surface region that is less than in a surface region adjacent to the predefined surface region, the surface having a soldering region to be wetted using a solder, the soldering region being adjacent to a predefined surface region having a lesser wettability;
applying a solder to the soldering region;
melting the solder; and
bringing the first and second components close together in order to bond the first and second components via the solder.

\* \* \* \* \*